United States Patent [19]

Kuroda et al.

[11] Patent Number: 5,479,138

[45] Date of Patent: Dec. 26, 1995

[54] MULTI-LAYER WIRING BOARD

[75] Inventors: Masao Kuroda; Sotaro Tsukamoto; Susumu Wakamatsu; Ryuji Imai, all of Nagoya, Japan

[73] Assignee: NGK Spark Plug Co., Ltd., Nagoya, Japan

[21] Appl. No.: 364,041

[22] Filed: Dec. 27, 1994

[30] Foreign Application Priority Data

Dec. 27, 1993 [JP] Japan .................................. 5-352131
Dec. 7, 1994 [JP] Japan .................................. 6-331145

[51] Int. Cl.⁶ ....................................................... H01P 3/08
[52] U.S. Cl. ................................................ 333/1; 333/238
[58] Field of Search ............................... 333/1, 238, 246, 333/99 R

[56] References Cited

U.S. PATENT DOCUMENTS 4,644,092  2/1987  Gentry .................................. 333/238 X
5,300,899  4/1994  Saski ......................................... 333/1

FOREIGN PATENT DOCUMENTS 1-37879   8/1989  Japan .
4-127598  4/1992  Japan .
267913   10/1993  Japan ..................................... 333/238

Primary Examiner—Paul Gensler
Attorney, Agent, or Firm—Foley & Lardner

[57] ABSTRACT

In a multi-layer wiring board having a strip line structure in which a grounding conductor wiring and a signal circuit wiring are disposed by interposing therebetween an insulation layer, the grounding conductor wiring is in the form of a grid and an open area ratio Rx [%] of the grid and a line width ratio Ry= Wg/Ws have a relationship expressed by Ry, $\leq 25.98 \times Rx^{-0.3871} - 4.370$ where Wg is the line width of the grounding conductor wiring, Sg is the width of an opening of the grid, Ws is the line width of the signal circuit wiring, and $Rx=\{Sg/(Wg+Sg)\}^2 \times 100$.

2 Claims, 4 Drawing Sheets

MULTI-LAYER WIRING BOARD

BACKGROUND OF THE INVENTION

1. Field of the Invention

The present invention relates in general to multi-layer wiring board structures and more particularly to a multi-layer wiring board having a strip line type signal transmission structure with a view to attaining high-frequency drive.

2. Disclosure Information

In a multi-layer wiring board which is provided with grounding conductor lines constituting a grounding conductor wiring or pattern and signal circuit lines constituting a signal circuit wiring or pattern at different insulation layers of a substrate, as a multi-layer wiring board having a strip line type signal transmission structure, an increasing number of grounding conductor patterns are formed not into a solid shape that has no openings or breaks but into a grid or lattice shape having openings at regular intervals, irrespective of the material of the insulation layers, i.e., whether the material of the insulation layers is ceramic or resin.

This is because the grid shape enables the gas produced at the time of firing of ceramic or curing of resin to be vented more easily than the solid shape and also because the grid shape enables the insulation layers to be thinner and therefore the wiring board to be thinner in its entirety than the solid shape if the wiring boards are the same in the designed characteristic impedance and the insulation material.

However, when, for example as shown in FIGS. 1A and 1B the grounding conductor pattern is formed into a grid shape, the signal circuit lines S1 and S3 which are located just above and under the lines of the grounding conductor wirings G1 and G2 formed into a grid-shape differs in characteristic impedance from the signal circuit lines that are not so located, that is, the signal circuit line S2 parallel to the grounding conductor wirings G1 and G2 and located just above or under the openings Gop of the grid shape. This is because the condition of coupling of the signal circuit line S1 or S3 with the grounding conductor wirings G1 and G2 differs from the condition of coupling of the signal circuit line S2 with the grounding conductor wirings G1 and G2. More particularly, the characteristic impedance of a signal circuit line S2 in the case the lines of the grounding conductor wirings G1 and G2 are located just above and under the signal circuit line S2 differs from that in the case the openings Gop are located just above and under the signal circuit line S2. That is, the signal circuit line S2 has portions of a high characteristic impedance and a low characteristic impedance alternating in the longitudinal direction thereof. In the meantime, strictly speaking, the characteristic impedance of the signal circuit line S1 or S3 varies cyclically in the longitudinal direction thereof but its variation is small and negligible so the characteristic impedance of the signal circuit line S1 is herein considered as being constant.

Due to this, in case such a signal circuit line S2 is connected to another signal circuit line, reflection of a transmission signal occurs due to the mismatching of characteristic impedance at the joining portion. Further, also within the signal circuit line S2 there occurs reflection of a transmission signal due to variations of the impedance. Such a reflected signal becomes a noise for a transmitting signal, so that a correct information is not transmitted to a functional device such as an integrated circuit (IC), etc., thus causing an erroneous operation.

Accordingly, it is required by signal transmission in a mutli-layer wiring board that the characteristic impedance be as constant as possible. That is, in a multi-layer wiring board having a plurality of signal circuit lines, it is required that the difference of the maximum and minimum values of the characteristic impedance of the signal circuit lines (hereinafter referred to as maximum deviation value) including both the difference of impedance between different signal circuit lines and the variations of impedance of one signal circuit line in the longitudinal direction thereof, is within a predetermined range. In many cases, the maximum deviation value is expressed by rate, and a value resulting from the division of the maximum deviation value by a design value is used to express a maximum deviation from the design value, which maximum deviation is required to be within 10% or less.

In order to meet with the requirement, it is considered to design the circuit so that the signal circuit lines, as the signal circuit lines S1 and S3 shown in FIG. 1, run only just above and below the lines of the ground conductor wirings G1 and G2. However, in such a case, there is caused such a design restriction that the interval between the adjacent two signal circuit lines is restricted to the pitch of the grid of the grounding conductor pattern.

To solve the above problem, such an arrangement as shown in FIG. 4 has also been proposed in which the grounding conductor lines constituting a grid-shaped grounding conductor pattern G and the signal circuit lines constituting a signal circuit pattern S are placed one above another in such a manner as to form an angle with each other, i.e., in such a manner as to cross each other as disclosed in JP-A-4-127598 (Japanese Patent Publication before examination). But, this leads to a design restriction that the both patterns need to be arranged so as to form an angle with each other or cross each other.

SUMMARY OF THE INVENTION

According to an aspect of the present invention, there is provided a novel and improved multi-layer wiring board which has a strip line structure in which a grounding conductor wiring and a signal circuit wiring are disposed by interposing therebetween an insulation layer, and which is characterized in that the grounding conductor wiring is in the form of a grid and that an open area ratio Rx [%] of the grid and a line width ratio $Ry = Wg/Ws$ have a relationship expressed by $Ry \leq 25.98 \times Rx^{-0.3871} - 4.370$ where Wg is the line width of the grounding conductor wiring, Sg is the width of an opening of the grid, Ws is the line width of the signal circuit wiring, and $Rx = \{Sg/(Wg+Sg)\}^2 \times 100$.

According to another aspect of the present invention, there is provided a novel and improved multi-layer wiring board which has a strip line structure in which a grounding conductor wiring and a signal circuit wiring are disposed by interposing therebetween an insulation layer, and which is characterized in that the grounding conductor wiring is in the form of a grid and that the line width Ws of the signal circuit wiring is expressed by $Ws \leq Wg/\}4.370 \times [Sg/(Wg+Sg)]^{-0.7742} - 4.370)$ where Wg is the line width of the grounding conductor wiring and Sg is the width of an opening of the grid.

The above structures are effective for solving the above noted problems inherent in the prior art multi-layer wiring board. That is, by designing a circuit of a multi-layer wiring board in such a way as to satisfy the above expressions, the maximum deviation of the characteristic impedance of the signal circuit lines can be reduced to 10% or less, so that the multi-layer wiring board can be improved in performance to such an extent that does not cause any problem in practical use. Further, the characteristic impedance of the signal circuit lines can be of such a maximum deviation from the design value that is equal to or lower than 10% irrespective of the locations of the signal circuit lines, provided that the above conditions are satisfied, thus making it possible to carry out the design of the circuit wiring of a multi-layer wiring board without any consideration on the deviation of the characteristic impedance which is determined depending upon the locations of the signal circuit lines.

It is accordingly an object of the present invention to provide a novel and improved multi-layer wiring board which can reduce the maximum deviation of the characteristic impedance of the signal circuit lines to 10% or less irrespective of the locations and pitch of the signal circuit lines and the angle which each signal circuit line and each grounding conductor line form with each other, whilst retaining an advantage of good gas venting and reduction of the thickness of the insulation layers, etc. due to employment of a grid-shaped grounding conductor pattern, and further which can make easier the design of the wiring board since the deviation of the characteristic impedance is held 10% or less.

DETAILED DESCRIPTION OF THE PREFERRED EMBODIMENT

Figure 1A:
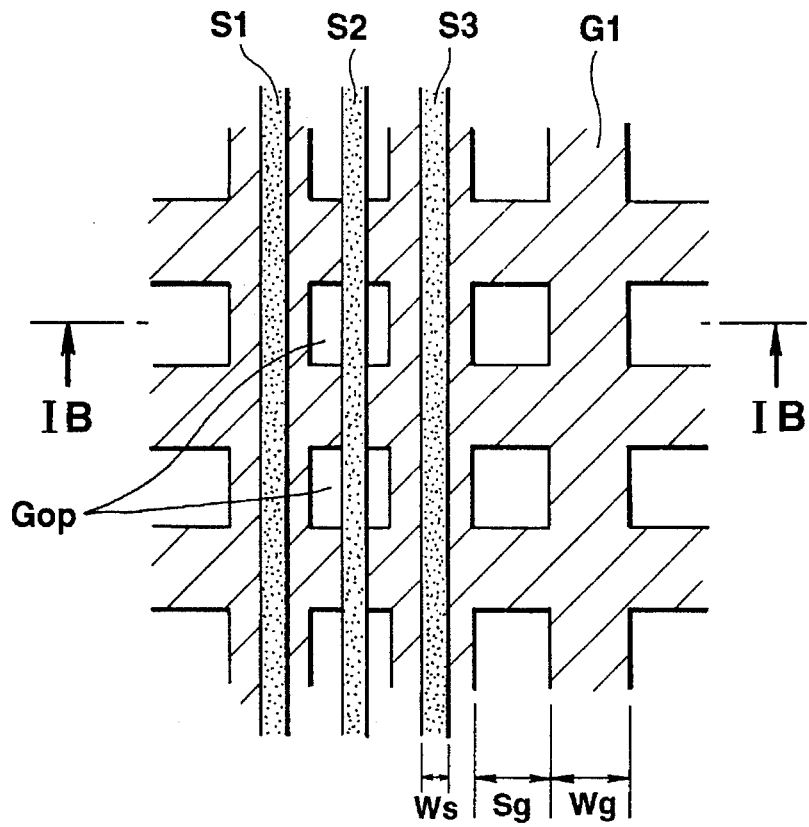
FIG. 1A is a fragmentary plan view of a wiring arrangement in a multi-layer wiring board which is taken in the direction of the arrows 1A—1A in FIG. 1B, with insulation layers being omitted for ease of understanding, and to which the present invention is applicable.
Figure 1B:
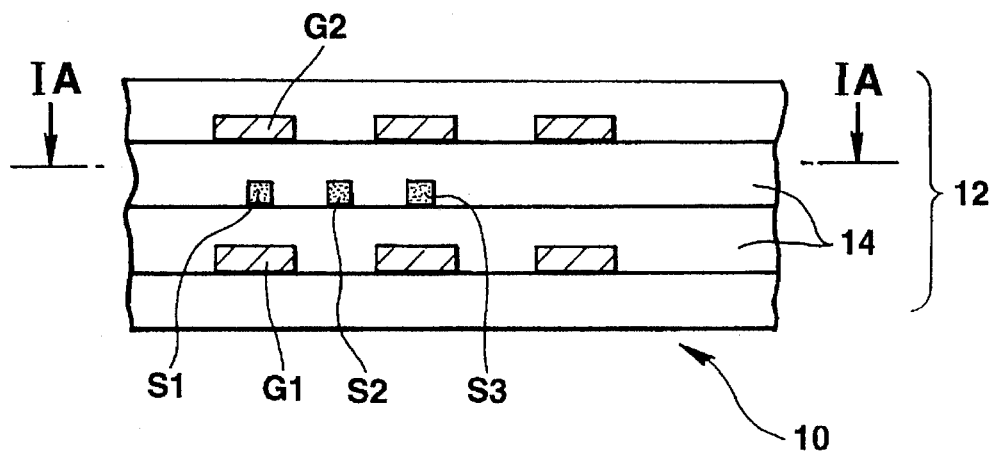
FIG. 1B is a sectional view taken along the line IB—IB of FIG. 1A.

Referring to FIGS. 1A and 1B, a multi-layer wiring board according to an embodiment of the present invention is generally indicated by 10. As seen from FIG. 1B, the multi-layer wiring board 10 is provided with a signal transmission area 12. The signal transmission area 12 includes two grounding conductor wirings, i.e., a lower grounding conductor wiring G1 and an upper grounding conductor wiring G2 disposed on the lower and upper sides of a signal circuit wiring including signal circuit lines S1, S2 and S3 by interposing therebetween insulation layers 14, and generally has a strip line type signal transmission structure. In the meantime, in FIG. 1A, the insulation layers 14 between signal circuit wiring and the grounding conductor wiring G1 and between the signal circuit wiring and the grounding conductor wiring G2 are omitted for ease of understanding, i.e., for facilitating the understanding of the positional relationship between the signal circuit wiring consisting of the signal circuit lines S1, etc. and the lower grounding conductor wiring G1. In the meantime, though not shown in FIG. 1A, the positional relationship between the signal circuit line S1, etc. and the upper grounding conductor wiring G2 is similar to that between the signal circuit line S1, etc. and the lower grounding conductor wiring G1. That is, the grounding conductor wirings G1 and G2 coincide with each other when observed in a plan view of the wiring board.

The grounding conductor wirings G1 and G2 each include a plurality of grounding conductor lines (no numeral) which intersect at right angle so as to constitute a grid or lattice shape having an equal pitch in both the lengthwise and breadthwise directions. The line width of the grounding conductor wirings G1 and G2 is indicated by Wg, and the width of an opening Gop of the grid, i.e., the width of an opening Gop between the adjacent two grounding conductor lines is designated by Sg. Further, the width of the signal circuit lines S1, S2, S3, etc. is designated by Ws. In this instance, a wiring board of such dimensions as to allow the relation between the line width ratio Ry=Wg/Ws and the open area ratio Rx (%) of the grid to be represented by the following expression, i.e., as to allow the line width ratio Ry=Wg/Ws to be located in the area lower than the curved line of FIG. 3, causes the maximum deviation of the characteristic impedance of the signal circuit lines to be reduced to 10% or less.

$$Ry \leq 25.98 Rx^{-0.3871} - 4.370$$

where Rx={Sg/(Wg+Sg)}$^2$×100.

Hereinbelow, it will be explained by simulation and actual measurement that the multi-layer wiring board having a strip line signal transmission structure, constructed so as to satisfy the above expression according to the present invention can make the signal circuit lines produce or effect only a small deviation (variation) of the characteristic impedance.

[Simulation]

The signal circuit lines S1 and S2 have the uniform width Ws=25 μm and it is assumed that polyimide of relative dielectric constant $\epsilon r$=3.2 is used as an insulation material for forming the insulation layers 14. Firstly, it is designed so that the characteristic impedance Z1 of the signal circuit line S1 lying above and under the lines of the grid-shaped grounding conductor wirings conforms to the design value of the characteristic impedance required for the signal circuit lines S1 and S2 of the multi-layer wiring board 10, that is, it is designed so that Z0=Z1=50Ω. Then, by keeping Z1=50Ω, the line width Wg of the grounding conductor wiring and the width Sg of an opening Gop of the grid are varied variously. In this instance, the characteristic impedance Z2 of the signal circuit line S2, which is arranged in parallel to the grounding conductor wirings G1 and G2, at the time when it becomes maximum, i.e., the maximum value Z2max of the characteristic impedance Z2 of the signal circuit line S2 in case the centers of the openings Gop are located above and under the signal circuit line S2 was measured by simulation. In the meantime, the minimum value of the characteristic impedance in the multi-layer wiring board is Z1 (=50Ω) and equal to the design value Z0.

The difference $\Delta$Zmax between the both impedances Z2max and Z1, i.e., $\Delta$Zmax=Z2max−Z1 was computed and then the maximum deviation of the characteristic impedance Dmax=($\Delta$Zmax/Z1)×100 [%] was computed. In the meantime, the characteristic impedance Z2max is the highest value in case the grounding conductor lines are not located above and under the signal circuit line, so Z2max>Z1, $\Delta$Zmax>0 and Dmax=0.

Figure 2:
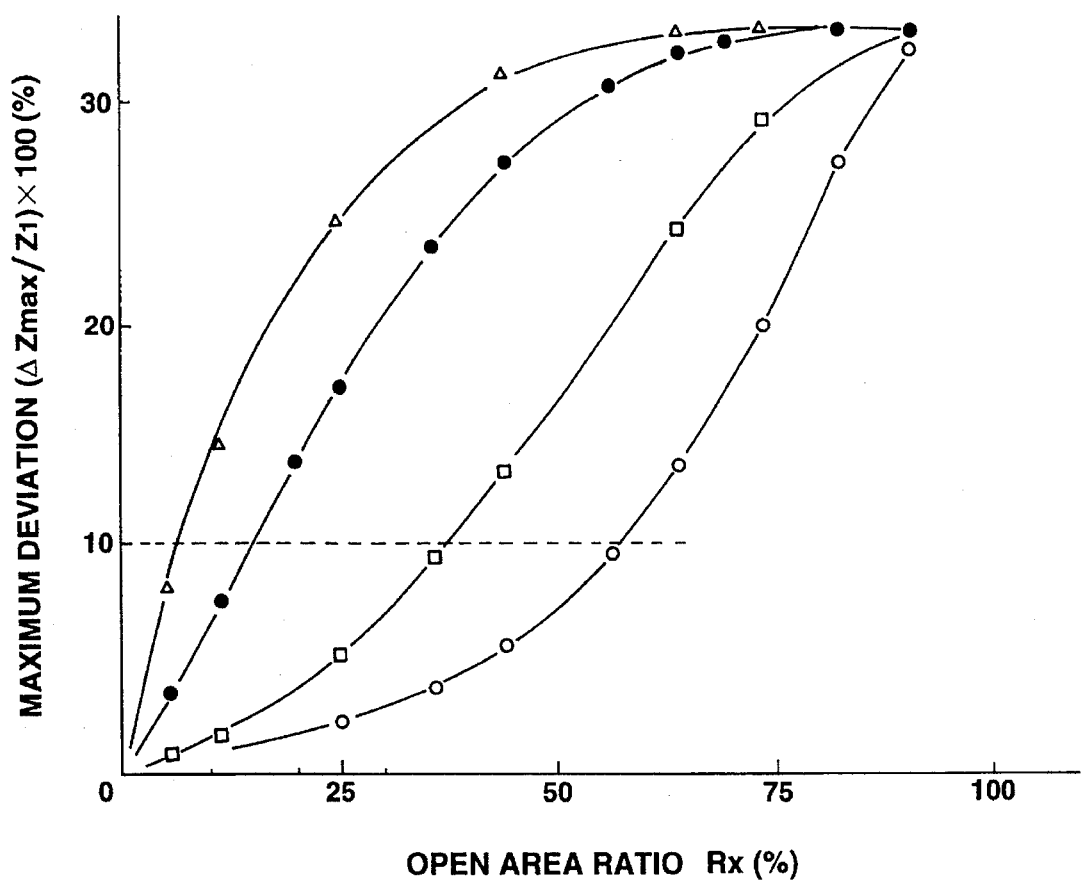
FIG. 2 is a graph of open area ratio Rx (%) vs. maximum deviation ($\Delta$Zmax/Z1)×100 (%) of characteristic impedance from design value for open area ratio Rx, wherein plots indicate computed values obtained by simulation and by using line width Wg of grounding conductor wiring as a parameter.

FIG. 2 shows a graph in which the computed values obtained by using Wg as a parameter were plotted, with open area ratio Rx as ordinate and Dmax=($\Delta$Zmax/Z1)×100 as abscissa. In the figure, the relation between the open area ratio Rx and the computed value Dmax is represented by the curve drawn by means of the plots $\Delta$ when Wg=200 μm, by means of the plots when Wg=125 μm, by means of the plots when Wg=50 μm and by means of the plots when Wg=25 μm.

Figure 3:
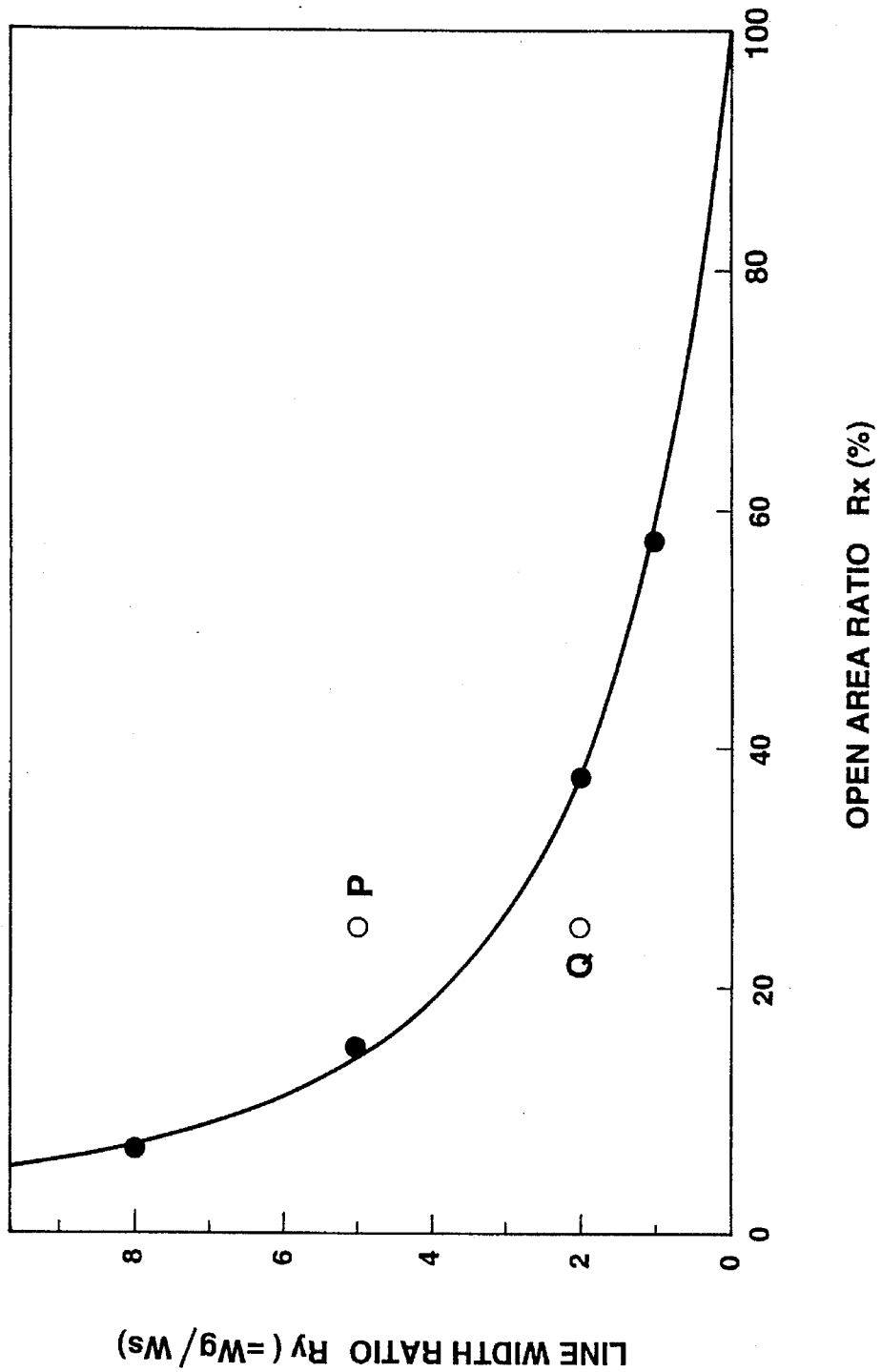
FIG. 3 is a graph of open area ratio Rx (%) vs. line width ratio Ry=(Wg/Ws) (%)
Figure 4:
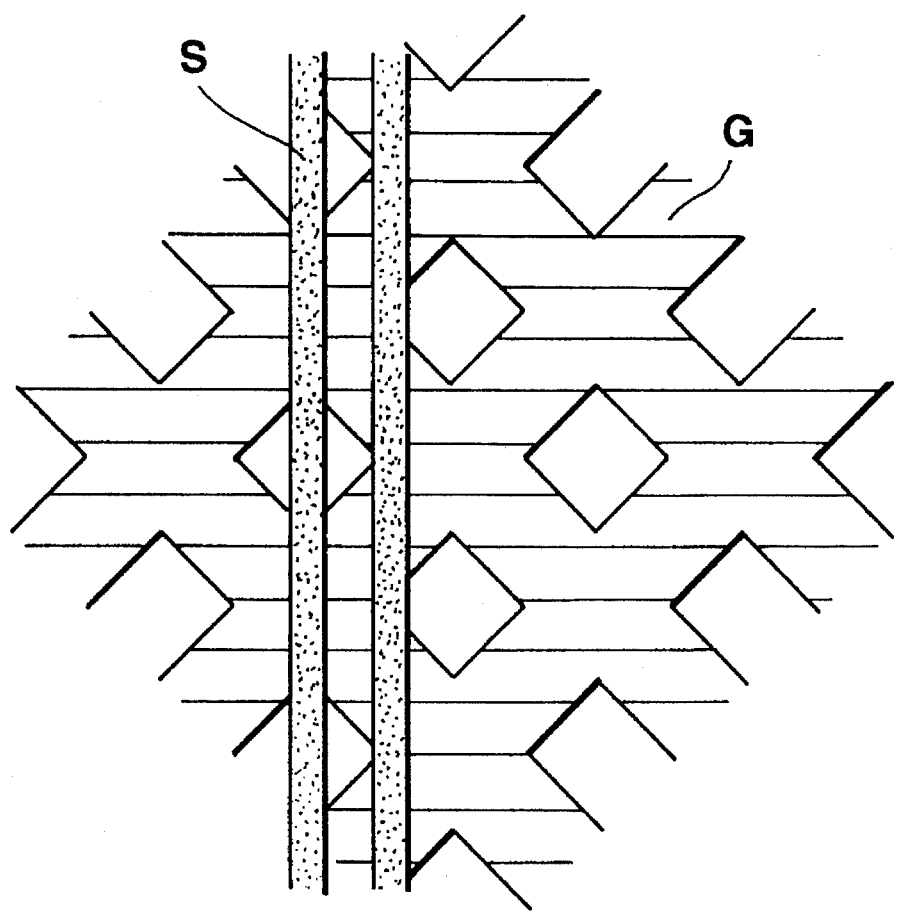
FIG. 4 is a view similar to FIG. IA but shows a prior art wiring arrangement in a multi-layer wiring board.

Then, the open area ratios Rx corresponding to the maximum deviation Dmax=($\Delta$Zmax/Z1)×100=10% were read on the graph of FIG. 2 and at the same time, since Ws=25 μm, the line width ratios Ry=Wg/Ws in those cases were obtained. The thus obtained data were plotted in the graph of FIG. 3, with the open area ratio Rx as ordinate and the line width ratio Ry= Wg/Ws as abscissa. Further, when the open area ratio Rx=0%, Sg=0, that is, the grounding conductor wiring is in the form of a solid sheet or plate having no openings or breaks, so Wg=∞. Accordingly, Ry=∞. Further, When Rx=100%, it is conditioned that there is not any grounding conductor wiring, so Wg=0 and therefore Ry=0. On consideration of the above and on the assumption that the relation between the line width ratio Ry and the open area ratio Rx can be expressed by a function in the form of Ry=aRx$^{-b}$–c (a, b and c are constants) a regression curve drawn on the basis of the plotted values is the solid line curve in FIG. 3, and the area on the lower side of the solid line curve is represented by the above described inequality. That is, in case the inequality is satisfied, even a maximum deviation of the characteristic impedance of the signal circuit line is equal to or smaller than 10%. In this connection, the graph of FIG. 3 is obtained by setting both Ws and Z1 to particular values, that is, by setting Ws=25 μm and Z1=50Ω. However, if Wg/Ws and Rx are constant, in other words, if the proportional relation of Wg, Sg and Ws is constant and Z0=Z1, the sectional shape of the signal transmission structure of the multi-layer wiring board can only vary into similar figures. That is, in regard to this embodiment, the sectional shape of the strip line structure shown in FIG. 1 (B) only vary into similar figures. When this is the case, the maximum deviation Dmax=($\Delta$Zmax/Z1)×100 of the characteristic impedance is constant. Further, the open area ration Rx and the line width ratio Ry are determined on the basis of the proportional relation of Wg, Sg and Ws. Accordingly, even if Ws and Z0 (=Z1) are altered into different values, it is constantly necessitated in order that Dmax =($\Delta$Zmax/Z1)×100 is equal to or lower than 10% that the maximum deviation Dmax is included within the range of 10% or less (i.e., Dmax≦10%) in the graph of FIG. 3, that is, the line width ratio Ry satisfies the relation expressed by Ry≦25.98×Rx$^{-0.3871}$ –4.370.

Accordingly, so long as the above described inequality is satisfied, the maximum deviation of the characteristic impedance Dmax=($\Delta$Zmax/Z1)×100 is always equal to or smaller than 10%.

[Example of Actual Measurement I]

A multi-layer wiring board 10 of Ws=25 μm, Wg=125 μm, Sg=125 μm, the insulation material being polyimide of ∈r=3.2, the open area ratio on calculation Rx=25, the line width ratio on calculation Ry=5, and of the kind shown in FIG. 1, was prepared. In this instance, the signal circuit line S2 is arranged so as to be parallel to the grounding conductor wiring G1 and run through the centers of the openings Gop, so the characteristic impedance Z2 of the signal circuit line S2 becomes of a maximum value Z2max at the portions located just above the centers of the openings Gop. The opening area ratio Rx and the line width ratio Ry of this multi-layer wiring board are represented by the point "P" in the graph of FIG. 3. In the meantime, the characteristic impedance was designed so that Z0=Z1=50Ω.

A pulse signal of the rise time of 35 psec was input to the signal circuit lines S1 and S2 of this wiring board and a reflected waveform was observed by means of an oscilloscope, i.e., a time domain reflection measuring method was performed to measure the characteristic impedance. Measurement of the characteristic impedance Z1 of the signal circuit line S1, the characteristic impedance Z2 of the signal circuit line S2 and the maximum value Zmax thereof and computation of $\Delta$Zmax=Z2max–Z1 were made, and it was found that $\Delta$Zmax was 10Ω. That is, it was recognized that the maximum deviation Dmax=($\Delta$Zmax/Z1) ×100 was increased up to 20%. This is because the multi-layer wiring board of this example did not satisfy the inequality Ry≦25.98×Rx$^{-0.3871}$–4.370 and so the maximum deviation exceeded beyond 10%.

[Example of Actual Measurement II]

A multi-layer wiring board of Ws=25 μm, Wg=50 μm, Sg=50 μm, the insulation material being polyimide of ∈r=3.2, the open area ratio on computation Rx=25%, the line width ratio on computation Ry=2, and of the kind shown in FIG. 1, was prepared. Also in this instance, the signal circuit line S2 is arranged so as to be parallel to the grounding conductor wiring G1 and run through the centers of the openings Gop similarly to the example (I). The multi-layer wiring board of this example corresponds to the point "Q" in the graph of FIG. 3. Further, similarly to the example (I), the characteristic impedance was designed so that Z0=Z1= 50Ω. The characteristic impedances Z1 and Z2 of the signal circuit lines S1 and S2 and the maximum value Zmax thereof were measured by a time domain reflection measuring method similarly to the above described example (I) and $\Delta$Zmax was computed, and computation of $\Delta$Zmax= Z2max–Z1 were made, and it was found that $\Delta$Zmax=2Ω. That is, it was recognized that the maximum deviation Dmax=($\Delta$Zmax/Z1)×100 was reduced to 4%. This is because the multi-layer wiring board of this example satisfied the inequality Ry≦25.98×Rx$^{-0.3871}$ –4.370 and so the maximum deviation became lower than 10%.

Accordingly, by selecting the dimensions of Ws, etc. in such a manner as to satisfy the above described inequality, the deviation of the maximum value Zmax of the characteristic impedance Z of the signal circuit wiring S from the characteristic impedance Z1 of the signal circuit line S1 corresponding to the minimum value Zmin can be equal to or lower than 10% even if the lines of the signal circuit wiring S are not arranged just above or under the lines of the grounding conductor wirings G1 and G2 but arranged so as to run through the centers of the openings Gop. For example, when Z0=Z1=50Ω, it is obtained that Zmax≦55Ω even if the lines of the signal circuit wiring S are arranged in any positions. That is, in the multi-layer wiring board, the deviation (variation) of the characteristic impedance due to the difference in arrangement of signal circuit lines can be equal to or lower than 10% or can be, when expressed by the amount of deviation, within the range of, for example, 50~55Ω.

Further, the above inequality can be transformed into Ws≦Wg/{4.370×[Sg/(Wg+Sg)]$^{-0.7742}$ –4.370). That is, by this expression, the width Ws of the signal circuit line for enabling the deviation (variation) of the characteristic impedance of the signal circuit line to be 10% or less can be obtained on the basis of the line width Wg of the grounding conductor wirings G1 and G2 and the width Sg of an opening Gop of the grid.

Further, in the above simulation and the examples of actual measurements (I) and (II), computation and measurement were made as to the case where the grid formed by the lower grounding conductor wiring G1 and the grid formed by the upper grounding conductor wiring G2 are laid one upon another or coincident to each other when viewed in the thickness direction of the insulation layers or when observed in a plan view of the wiring board and the signal circuit wiring including the signal circuit lines S1, S2 and S3 is formed so as to be parallel to the grounding conductor wirings G1 and G2.

This is because when grounding conductor lines are located just above and under a signal circuit line as, for example, the signal circuit line S1, the signal circuit line can have a minimum characteristic impedance and effect a minimum variation of the characteristic impedance in the longitudinal direction thereof, so such a signal circuit line is used for preference on design.

Further, to use the minimum characteristic impedance of the signal circuit line S1 as a reference for computation of a higher characteristic impedance of a signal circuit line such as, for example, the signal circuit line S2, is convenient for computation of the maximum deviation Dmax.

In the meantime, according to the present invention, the maximum deviation of the maximum characteristic impedance Z2max from the minimum characteristic Z1 is equal to or lower than 10%. Accordingly, in case the grid formed by the lower grounding conductor wiring G1 and the grid formed by the upper grounding conductor wiring G2 are not coincident or aligned with each other but misaligned or discrepant from each other when observed in a plan view of the wiring board, the deviation becomes further smaller and it becomes possible to make the variation of the characteristic impedance further smaller. This is because the impedance corresponding to the characteristic impedance of the signal circuit line S1 increases, whereas the impedance corresponding to the maximum characteristic impedance Z2max of the signal circuit line S2 reduces. That is, by constructing the grounding conductor lines and the signal circuit lines in such a manner as to satisfy the above described inequality according to the present invention, it becomes possible to prevent the deviation from increasing up to maximumly 10% in case the grids formed by the upper and lower grounding conductor wirings are coincident or aligned with each other when observed in the thickness direction or in a plan view of the wiring board. On the other hand, in case the grids are misaligned, the deviation can be made further smaller.

In the meantime, the misalignment or discrepancy of the two grids when observed in the thickness direction or in a plan view of the wiring board, occurs firstly in such a case where one of the grids is moved horizontally and in parallel to the other of the grids from a position where it can be aligned with the other grid. Secondly, two grids are disposed so as to form an angle with each other when observed in a plan view, that is, one of the grids is rotated horizontally from a position where it can be aligned with the other of the grids. Further, the misalginement may occur in case of combination of the above phenomena.

Further, while polyimide has been described as being employed for the insulation material of the insulation layer, this is not for the purpose of limitation but any material which is suited for signal transmission and is low in dielectric constant can be used in place therefor.

That is, in place for polyimide, an organic insulation material such as epoxy, BCB (benzocyclobutene), etc., a ceramic material such as glass ceramic, mullire, etc., glass such as borosilicate glass, borosilicate lead glass, etc., and diamond formed into a thin film, etc. can be used. Preferably, a material of relative dielectric constant $\varepsilon r$ of 4 or less is suitable.

From the foregoing, it will be understood that the multi-layer wiring board of the present invention can reduce the maximum deviation of the characteristic impedance of the signal circuit lines to 10% or less irrespective of the locations and pitch of the signal circuit lines and the angle which each signal circuit line and each grounding conductor line form with each other, whilst retaining an advantage of good gas venting and reduction of insulation layers, etc. due to employment of a grounding conductor pattern of a grid shape, and further which can make easier the design of the wiring board since the deviation of the characteristic impedance is held 10% or less.

What is claimed is:

1. A multi-layer wiring board having a strip line structure in which a grounding conductor wiring and a signal circuit wiring are disposed by interposing therebetween an insulation layer, characterized in that said grounding conductor wiring is in the form of a grid and that an open area ratio Rx [%] of said grid and a line width ratio Ry=Wg/WS have a relationship expressed by $$Ry \leq 25.98 \times Rx^{-0.3871} - 4.370$$

where Wg is the line width of said grounding conductor wiring, Sg is the width of an opening of said grid, Ws is the line width of said signal circuit wiring, and $Rx = \{sg/(wg+sg)\}^2 \times 100$.

2. A multi-layer wiring board having a strip line structure in which a grounding conductor wiring and a signal circuit wiring are disposed by interposing therebetween an insulation layer, characterized in that said grounding conductor wiring is in the form of a grid and that the line width Ws of said signal circuit wiring is expressed by $$Ws \geq Wg / \{4.370 \times [Sg/(Wg+Sg)]^{-0.7742} - 4.370\}$$

where Wg is the line width of said grounding conductor wiring and Sg is the width of an opening of said grid.

\* \* \* \* \*